US006798260B1

(12) United States Patent
Wittlinger

(10) Patent No.: US 6,798,260 B1
(45) Date of Patent: Sep. 28, 2004

(54) MARGINING PIN INTERFACE AND CONTROL CIRCUIT

(75) Inventor: Harold Allen Wittlinger, Pennington, NJ (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/379,140

(22) Filed: Mar. 4, 2003

(51) Int. Cl.[7] .................................................. H03L 7/06
(52) U.S. Cl. ........................................ 327/157; 327/333
(58) Field of Search ................................ 327/157, 333; 326/30, 37, 38

(56) References Cited

U.S. PATENT DOCUMENTS 5,508,650 A 4/1996 Grimm et al. .............. 327/365
6,111,469 A * 8/2000 Adachi ........................ 331/17
6,286,127 B1 9/2001 King et al. .................... 716/8
6,424,211 B1 7/2002 Nolan et al. ................... 330/2

* cited by examiner

*Primary Examiner*—Kenneth B. Wells
(74) *Attorney, Agent, or Firm*—Allen, Dyer, Doppelt, Milbrath & Gilchrist, P.A.

(57) ABSTRACT

A voltage margin circuit has an input that receives a control voltage for programming an output reference voltage. The control voltage is coupled through an input resistor to an operational amplifier, referenced to a voltage midway between the voltage range of the input voltage and having its output coupled to a pair of transistors, whose current flow paths are coupled to inputs of a first pair of current mirrors. Outputs of the first current mirrors pair are cross-coupled to inputs of a second current mirrors pair. Outputs of the second current mirror pair are coupled through an output resistor to a prescribed voltage. The output reference voltage is the sum of the prescribed voltage and an offset as the product of the output resistor and an output current supplied by one of the third and fourth current mirrors.

14 Claims, 1 Drawing Sheet

MARGINING PIN INTERFACE AND CONTROL CIRCUIT

FIELD OF THE INVENTION

The present invention relates to voltage level control circuits, and is particularly directed to a voltage margin setting interface circuit having a single input pin, and being capable of programming a reference voltage level, such as may be supplied to an error amplifier of a voltage regulator circuit of the power supply of a personal computer.

BACKGROUND OF THE INVENTION

The technique of varying the voltage to various controller integrated circuits is termed 'power margining'. This technique has become increasingly important for the portable computer market, where the processor voltage is controllably increased depending upon operational demands. For example, the power may be decreased during low processing requirements, to result in a reduction in standby power. In a complementary manner, when there is a need for faster signal processing, for example, in graphics processing applications, processor speed must be increased to handle rapid or complex display changes. Associated with this increase in processor speed, the supply voltage is also increased to accommodate temporary high performance and power demands. On the other hand, when there is no need for speed, the power to the processor is reduced by way of a lower processor voltage, resulting in improved power supply economy.

SUMMARY OF THE INVENTION

With this objective in mind, the present invention is directed to a new and improved power margining interface, configured to provide on-demand adjustment of a reference voltage by way of a single input pin. For this purpose, a current direction control circuit is coupled between a single input pin and an output port from which a controllably adjustable reference voltage is to be derived. In response to a first input current state, the current direction control circuit causes a prescribed current to flow in a first direction through an output resistor that is coupled to the output port, so as to increase the output voltage relative to a prescribed reference voltage. Conversely, in response to a second input current state, the current direction control circuit causes a prescribed current to flow in a second direction through the output resistor, so as to decrease the output voltage relative to the prescribed reference voltage.

The current direction control circuit is implemented by coupling the control or input voltage through an input resistor to a single operational amplifier, which is referenced to a voltage midway between the voltage range of the input voltage and having its output coupled to a pair of complementary polarity transistors, operating in their linear range. These transistors have their current flow paths coupled in series to the drive inputs of a first pair of current mirror amplifier stages, referenced to opposite polarity voltages.

The first pair of current mirror amplifiers have their mirrored current outputs cross-coupled to inputs of a second pair of current mirror amplifiers, whose mirrored current outputs are coupled to a common output node. This output node is coupled through a series resistor to a voltage reference terminal to which a prescribed reference voltage, such as that supplied by a digital-to-analog converter may be supplied. The output node may be coupled to an error amplifier of a voltage regulator circuit of a personal computer power supply, as described above. Variations in input current and thereby the voltage input to the operational amplifier relative to its reference voltage are used to adjust the current mirrored current through the series output resistor, so as to increase or decrease the output reference voltage.

BRIEF DESCRIPTION OF THE DRAWINGS

The single FIGURE illustrates the circuit configuration of the voltage margin setting interface circuit in accordance with the invention.

DETAILED DESCRIPTION

Figure 1:
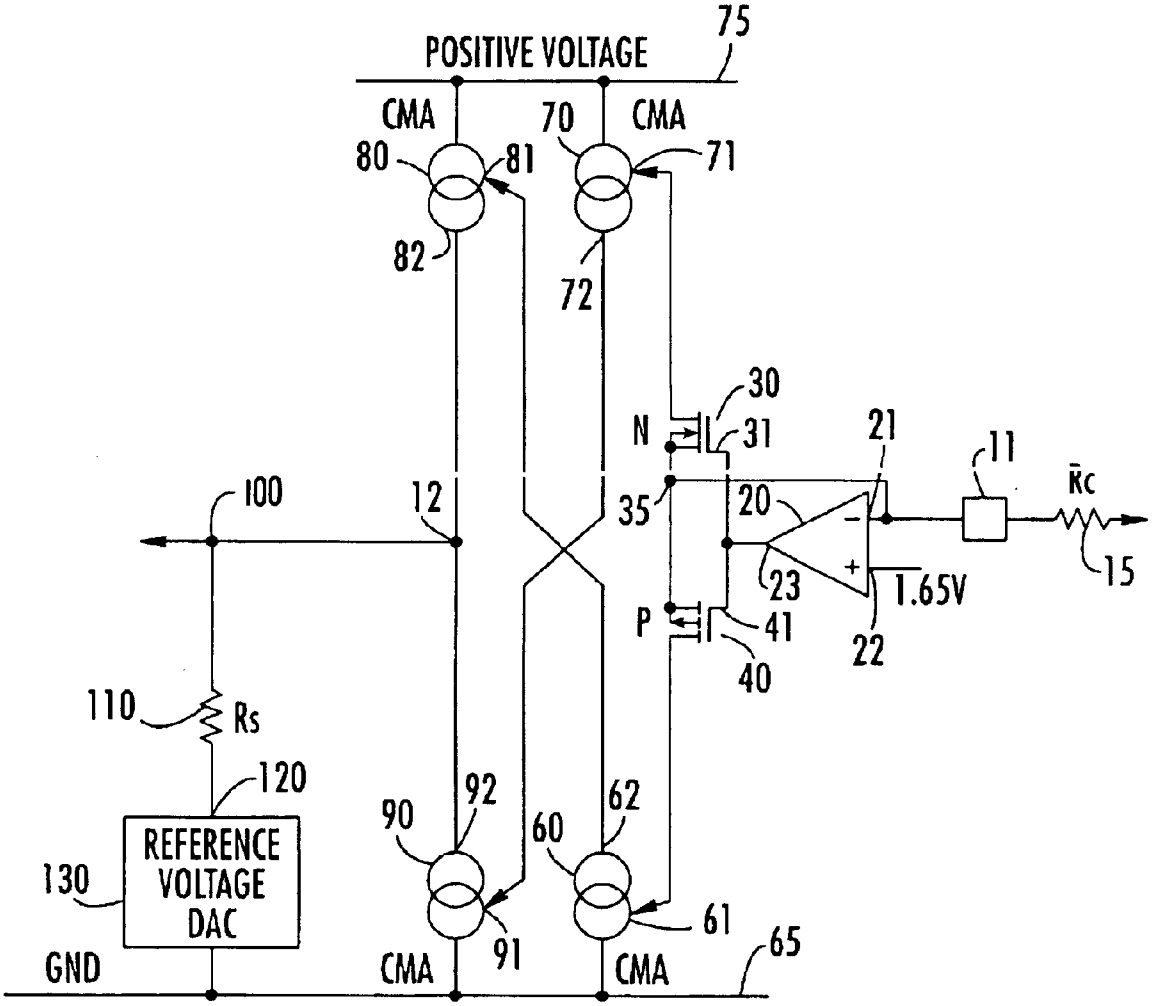

An integrated circuit implementation of the current-based voltage margin setting interface circuit in accordance with a preferred embodiment of the present invention is shown in FIG. 1 as comprising an input port 11 to which a voltage margin control voltage is supplied by way of an input resistor 15. For purposes of providing a non-limiting parametric example, the control voltage may be varied between a lower voltage of zero volts (or ground) and an upper voltage of 3.3 volts; it may also be open or set halfway of the 0–3.3 volt voltage range, i.e., set at 1.65 volts. The current flow effects of these respective parameter settings will be described below.

The control voltage is converted to an input control current at input terminal 11 by an input scaling resistor 15, which may be external to the overall integrated circuit. Input port 11 is coupled to a current direction control circuit having an output 12 coupled to an output node 100. As pointed out briefly above, and as will be detailed below, for a first input current state, the current direction control circuit is operative to cause a current the is proportional to the input current to flow in a first direction through an output resistor 110 that is coupled to output node 10, so as to increase the output voltage at node 100 relative to a reference voltage supplied to a node 120. Conversely, in response to a second input current state, the current direction control circuit causes a current proportional to input current to flow in a second direction through output resistor 110, so as to decrease the output voltage at node 100 relative to the reference voltage.

To this end, input node 11 is coupled a first, inverting (–) input 21 of an operational amplifier 20, a second, non-inverting (+) input 22 of which is coupled to a prescribed reference potential (e.g., 1.65 volts). Input port 11 is further coupled to a common node 35 between a first N-channel field effect transistor (FET) 30 and a second P-channel FET 40. Coupling input port 11 to node 35 between the two complementary polarity channel FETs allows current to flow either into or out of input port 11. (While transistors 30 and 40 are shown as field effect devices, it is to be understood that alternative equivalent devices, such as bipolar components, may be employed in place thereof, without a loss in generality.)

Operational amplifier 20 has its output 23 coupled to control or gate inputs 31 and 41, respectively, of the FETs 30 and 40, the source-drain paths of which are coupled in series between the input 61 of a first current mirror amplifier (CMA) 60, which is referenced to a voltage rail 65, which is coupled to ground and the input 71 of a second CMA 70, which is referenced to a positive voltage rail 75. Current mirror amplifiers are highly accurate and precisely reflect their input current. As a non-limiting example, the current mirror amplifiers may be configured as a classical Wilson current mirror, or that described in the U.S. Patent to Wittlinger, U.S. Pat. No. 3,835,410. Also the input/output ratios of the current mirrors may be 1:1.

CMA 60 has its mirrored current output 62 cross-coupled to the input 81 of a third CMA 80, which is referenced to the positive voltage rail 65, while CMA 80 has its mirrored current output 82 cross-coupled to the input 91 of a fourth CMA 90, which is referenced to the ground voltage rail 65. CMAs 80 and 90 have their respective mirrored current outputs 82 and 92 tied to a common output node 100. Output node 100 is coupled through a series resistor 110 to a voltage reference terminal 120. The voltage reference terminal is coupled to receive a prescribed reference voltage, such as that supplied by a digital-to-analog converter 130. The output node 100 may be coupled to an error amplifier of a voltage regulator circuit of a personal computer power supply, as described above.

The voltage margin setting interface circuit of the FIGURE operates as follows. Operational amplifier 20 is connected as a current converter, referenced to a voltage midway of the voltage range of the input control voltage which, in the present example is 0–3.3 V, so that the reference voltage is 1.65 volts, as described above. For a first (inactive) state, where there is to be no departure in output voltage from the voltage supplied by voltage reference 130, the input voltage can be either open, or coupled to receive the 1.65 reference voltage supplied that is coupled to the non-inverting (+) input 22 of the operational amplifier 20. For either of these input conditions, the output 23 of the operational amplifier 20 is at zero volts and neither MOSFET 30 nor MOSFET 40 is active. As a result, no current is mirrored by the current mirror amplifier stages, so that no current is injected into or drawn out of node 100 by the current mirror amplifier stages. As a consequence, the voltage at output node 100 is at the reference voltage (DAC) 130.

To controllably increase the voltage at output node 100 to a value above the reference voltage at node 130, a relatively high input voltage, namely, a voltage greater than the (+1.65 V) reference voltage coupled to the (+) input port 22 (e.g., +3.3 volts) is applied to input port 11, and thereby to the (−) input 21 of the operational amplifier 20. In response thereto, the output 23 of operational amplifier 20 goes negative by a value that is proportional to the input current through input resistor 15, which drives the P-channel FET 40 active, while the N-channel FET 30 is inactive. With P-channel FET 40 active, current flows from the input port 11 through the source-drain path of P-channel FET 40 and into the input port 61 of CMA 60. CMA 60 mirrors this input current as a current flowing into output 62 port. With output port 62 of CMA 60 being coupled to the input port 81 of CMA 80, this current flows out of the input port 81 of CMA 80. The output port 82 of CMA 80 thereby mirrors this current as a positive current flowing out of its output 82, which is coupled to the output port 12, and thereby into output resistor 110. With the direction of current flow being into the output resistor 110, the voltage at output node 100 will be increased to a value corresponding to the reference voltage at node 120 plus an incremental or fractional voltage value defined by the product of the mirrored current and the value of the output resistor 110.

In a complementary manner, to controllably decrease the voltage at output node 100 to a value below the reference voltage at node 130, a relatively low input voltage, namely, a voltage less than the (+1.65 V) reference voltage coupled to the (+) input port 22 (e.g., zero volts) is applied to input port 11, and thereby to the (−) input 21 of the operational amplifier 20. In response thereto, the output 23 of operational amplifier 20 goes high or positive by a value proportional to the input current through input scaling resistor 15, activating N-channel FET 30, while P-channel FET 40 is deactivated. This causes current to flow out of the input port 71 of CMA 70 through the drain-source path of N-channel FET 30 and into the input port 11. CMA 70 mirrors this current flowing out of its input port 71 as a current flowing out of its output port 72. Since CMA output port 72 is coupled to input port 91 of CMA 90, the latter mirrors the current flowing into its input port 91 as an output current flowing into its output port 92. With output 92 of CMA 90 coupled to output port 12, and thereby to output resistor 110, a current now flows out of node 120, through resistor 110 and from node 110 into output port 92 of CMA 90. With the direction of current flow now being out of the output resistor 110, the voltage at output node 100 will be decreased to a value corresponding to the reference voltage at node 120 minus an incremental or fractional voltage value defined by the product of the mirrored current and the value of the output resistor 110.

As will be appreciated from the foregoing description, via a single input or control pin, the voltage margin setting interface circuit of the invention provides for the incremental programming (increase or decrease) of a positive and negative voltage level relative to a reference voltage, and thereby adjusts the magnitude of the reference output voltage. As the invention allows the reference voltage to be adjusted on demand to either a higher or lower value, it is readily suited to the supply and adjustment of a reference voltage supplied to an error amplifier of a voltage regulator circuit of the power supply of a personal computer.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A circuit for providing a controllable reference DC voltage comprising:

an input port to which an input current is coupled;

an output port coupled through an output resistor to a terminal coupled to receive a prescribed DC voltage; and a current direction control circuit, coupled between said input port and said output port and operative, in response to a first direction of input current relative to said input port, to cause a prescribed current to flow in a first direction through said output resistor so as to cause said output port to produce an increased DC output voltage and, in response to a second direction of input current relative to said input port, to cause a prescribed current to flow in a second direction through said output resistor so as to cause said output port to produce a decreased DC output voltage.

2. The circuit according to claim 1, wherein said current direction control circuit is operative, in response to said first direction of input current relative to said input port, to cause a DC voltage developed across said output resistor to constructively combine with said prescribed DC voltage and thereby produce said increased output voltage and, in response to said second direction of input current relative to said input port, to cause a DC voltage developed across said output resistor to destructively combine with said prescribed DC voltage and thereby produce said decreased DC output voltage.

3. The circuit according to claim 1, wherein said current direction control circuit comprises:

an operational amplifier having an input coupled to said input port and an output;

a first current mirror circuit referenced to a first voltage and having an input and an output;

a second current mirror circuit referenced to a second voltage and having an input and an output;

a third current mirror circuit referenced to said first voltage and having an input and an output;

a fourth current mirror circuit referenced to said second voltage and having an input and an output;

first and second transistor devices having current flow paths therethrough coupled in series between the input of said first current mirror circuit and the input of said second current mirror circuit, and wherein control ports of said first and second transistor devices are coupled to the output of said operational amplifier; and wherein the outputs of said first and second current mirror circuits are coupled to the inputs of said third and fourth current mirror circuits; and the outputs of said third and fourth current mirror circuits are coupled to sail output port;

whereby said controllable reference DC voltage corresponds to said prescribed DC voltage and an offset DC voltage defined by the product of the value of said output resistor and the value of output current supplied by one of said third and fourth current mirror circuits to said output port.

4. The circuit according to claim 3, wherein the input of said operational amplifier is coupled to said current flow paths through said first and second transistor devices.

5. The circuit according to claim 3, wherein the input of said operational amplifier is coupled to a common connection of said first and-second transistor devices.

6. The circuit according to claim 3, wherein said first and second transistor devices are complementary polarity transistor devices.

7. The circuit according to claim 6, wherein said reference potential is between said first and second voltages.

8. The circuit according to claim 3, wherein said current mirror circuits comprise current mirror amplifiers.

9. A method of providing a controllably adjustable reference DC voltage comprising the steps of:

(a) providing an input port;

(b) providing an output port coupled through an output resistor to a terminal coupled to receive a prescribed DC voltage; and (c) controllably coupling an input current to said input port, such that for a first direction of said input current flow relative to said input port, a first DC voltage is developed across said output resistor that constructively combines with said prescribed DC voltage and thereby produces an increased value of said reference DC voltage at said output port and, for a second direction of said input current flow relative to said input port, a second DC voltage is developed across said output resistor that destructively combines with said prescribed DC voltage and thereby produce a decreased value of said reference DC voltage.

10. The method according to claim 9, wherein step (c) comprises:

(c1) coupling an input current to an operational amplifier and to the current flow path of first and second complementary transistor devices, that are coupled in series between inputs of first and second current mirror circuits referenced to respectively different DC voltages;

(c2) coupling an output of said operational amplifier to control inputs of said first and second complementary transistor devices;

(c3) coupling an output of one of said first and second current mirror circuits to a third current mirror circuit referenced to one of said different DC voltages;

(c4) coupling an output of another of said first and second current mirror circuits to a fourth current mirror circuit referenced to another of said different DC voltages; and (c5) coupling outputs of said third and fourth current mirror circuits through a resistor to a prescribed DC voltage;

whereby said reference DC voltage corresponds to said prescribed DC voltage and an offset DC voltage defined by the product of the value of said output resistor and the value of output current supplied by one of said third and fourth current mirror circuits to said output port.

11. The method according to claim 10, wherein step (c1) comprises coupling said input of said operational amplifier to a common connection of said first and second transistor devices.

12. The method according to claim 10, wherein said first and second transistor devices are complementary polarity field effect transistors.

13. The method according to claim 10, wherein the input of said operational amplifier is coupled through a scaling resistor to an input voltage from which said input current is produced.

14. The method according to claim 10, wherein said current mirror circuits comprise current mirror amplifiers.

* * * * *